(12) United States Patent
Nam et al.

(10) Patent No.: US 11,437,570 B2
(45) Date of Patent: Sep. 6, 2022

(54) RESISTIVE SWITCHING MEMORY DEVICE BASED ON MULTI-INPUTS

(71) Applicants: YONSEI UNIVERSITY, UNIVERSITY-INDUSTRY FOUNDATION (UIF), Seoul (KR); Seoul National University R&DB Foundation, Seoul (KR)

(72) Inventors: Ki Tae Nam, Seoul (KR); Ouk Hyun Cho, Seoul (KR); Jang-Yeon Kwon, Seoul (KR); Min-Kyu Song, Ulsan (KR); Seok Namgung, Daejeon (KR); Hyeohn Kim, Seoul (KR); Yoon Ho Lee, Seoul (KR)

(73) Assignees: YONSEI UNIVERSITY, UNIVERSITY—INDUSTRY FOUNDATION (UIF), Seoul (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 137 days.

(21) Appl. No.: 16/932,029

(22) Filed: Jul. 17, 2020

(65) Prior Publication Data

US 2021/0050514 A1 Feb. 18, 2021

(30) Foreign Application Priority Data

Aug. 16, 2019 (KR) .......... 10-2019-0100119
Feb. 17, 2020 (KR) .......... 10-2020-0018954

(51) Int. Cl.
*H01L 45/00* (2006.01)
*G11C 13/00* (2006.01)

(52) U.S. Cl.
CPC ........ *H01L 45/085* (2013.01); *G11C 13/0009* (2013.01); *G11C 13/0019* (2013.01);
(Continued)

(58) Field of Classification Search
CPC ... H01L 45/085; H01L 45/1266; H01L 45/14; H01L 45/1226; H01L 45/1233; G11C 13/0009; G11C 13/0019; G11C 13/0069
See application file for complete search history.

(56) References Cited

U.S. PATENT DOCUMENTS

2006/0079455 A1* 4/2006 Gazit ............... C07K 5/06078
514/21.91

FOREIGN PATENT DOCUMENTS

JP 6102121 B2 3/2017
JP 2018504597 A 2/2018
(Continued)

OTHER PUBLICATIONS

Gurme, et al. An Organic Bipolar Resistive Switching Memory Device Based on Natural Melanin Synthesized From *Aeromonas* sp. SNS, Phys. Status Solidi A, 2018, 215, 1800550 (Year: 2018).*
(Continued)

*Primary Examiner* — Jerome Leboeuf
(74) *Attorney, Agent, or Firm* — Cantor Colburn LLP

(57) ABSTRACT

A resistive switching memory device according to an exemplary embodiment includes: a first electrode; a second electrode formed to be separated from the first electrode; and an insulating layer formed near the first electrode and the second electrode, and changed to one of a high resistance state and a low resistance state when a conductive filament is controlled by a change of external humidity or a voltage applied through the first electrode or the second electrode.

12 Claims, 26 Drawing Sheets

(52) U.S. Cl.
CPC ...... *G11C 13/0069* (2013.01); *H01L 45/1266* (2013.01); *H01L 45/14* (2013.01)

(56) References Cited

FOREIGN PATENT DOCUMENTS

| | | |
|---|---|---|
| KR | 1020110024637 | 3/2011 |
| KR | 1001360407 B1 | 2/2014 |
| KR | 1020180048132 | 5/2018 |
| KR | 1020190065980 A | 6/2019 |
| KR | 101962030 B1 | 7/2019 |
| WO | 2014030393 | 2/2014 |

OTHER PUBLICATIONS

Song, et al. Proton-enabled activation of peptide materials for biological bimodal memory, Nature Communications, 2020, 11:5896 (Year: 2020).*

Hyung-Seok Jang et al., Tyrosine-mediated two-dimensional peptide assembly and its role as a bio-inspired catalytic scaffold, Article, 2014, 11 pages, Nature Communications.

Jaehun Lee et al., Proton Conduction in a Tyrosine-Rich Peptide/ Manganese Oxide Hybrid Nanofilm, 2017, 9 pages, 27, Advanced Functional Materials.

Taehoon Sung et al., Effects of proton conduction on dielectric properties of peptides, Journal Article, 2018, 34047-34055, 8, Royal Society of Chemistry.

\* cited by examiner

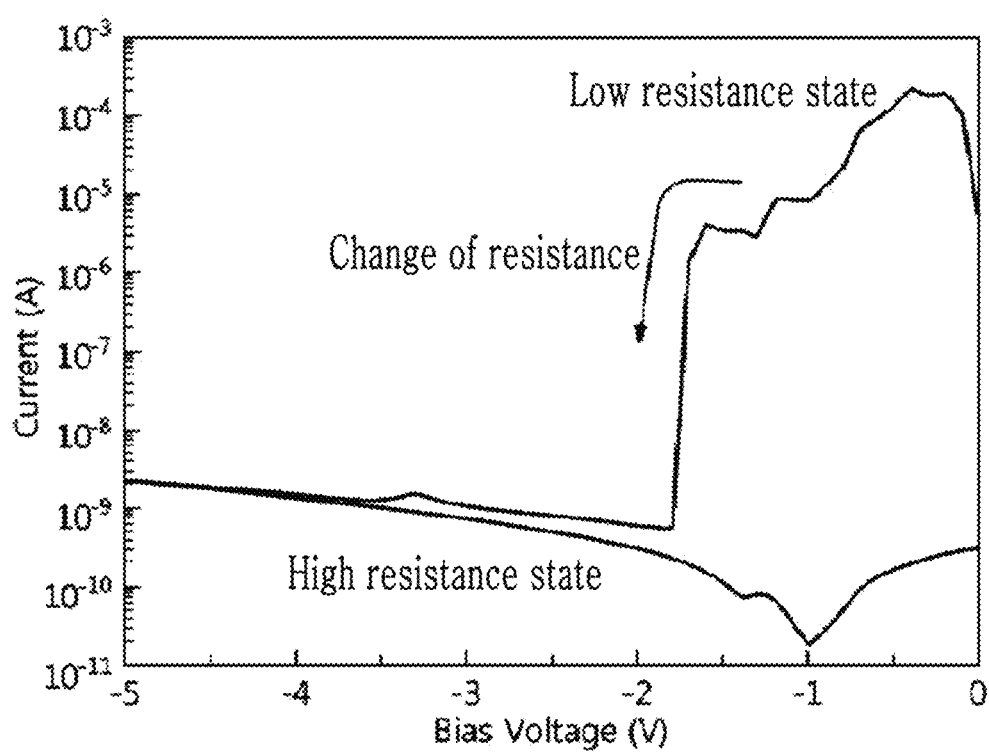

510

520

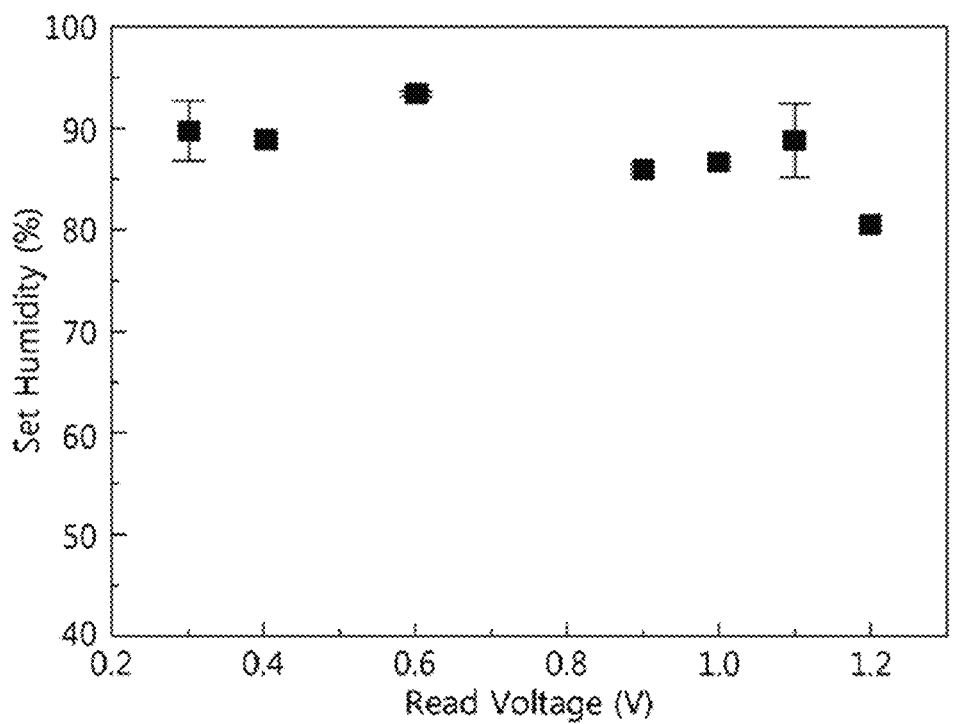

620

720

820

RESISTIVE SWITCHING MEMORY DEVICE BASED ON MULTI-INPUTS

CROSS-REFERENCE TO RELATED APPLICATION

This application claims priority to and the benefit of Korean Patent Applications No. 10-2019-0100119 filed in the Korean Intellectual Property Office on Aug. 16, 2019 and No. 10-2020-0018954 filed in the Korean Intellectual Property Office on Feb. 17, 2020, the entire contents of which are incorporated herein by reference.

BACKGROUND

(a) Field

The present invention relates to a resistive switching memory device. More particularly, the present invention relates to a technical scope of a resistive switching memory device based on multi-inputs.

(b) Description of the Related Art

As integration of memories has reached its limits, so as to replace the technique of the flash memory that is a non-volatile memory, next-generation memory technologies such as a resistance random access memory (ReRAM), a phase-change random access memory (PcRAM), and a spin transfer torque magnetic random access memory (STTRAM) for forming cells with a simple structure are developed.

☐Among the above-described next-generation memories, the resistance random access memory (ReRAM) is a next-generation non-volatile memory with a simple metal-insulator-metal (MIM) structure and an excellent operational characteristic, and it is more actively researched than other next-generation memories.

In the resistive switching memory device relating field, so as to improve the memory characteristic of the device, needs on development and application of a new driving method differentiating from the above-described controlling method are increasing.

Accordingly, the present invention provides a resistive switching memory device based on multi-inputs for controlling a conductive filament corresponding to changes of external humidity in addition to changes of a voltage, and a manufacturing method thereof.

PRIOR ART DOCUMENT

Patent
(Patent 1) Korea Registered Patent No. 10-2019-0065980 "Next Generation Non-Volatile Mott Memory Device using Characteristic of Transition Metal Oxides"

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a resistive switching memory device based upon multiple inputs for controlling changes of a voltage applied through a first electrode or a second electrode and formation of a conductive filament corresponding to changes of external humidity.

The present invention has been made in another effort to provide a resistive switching memory device based upon multiple inputs for reducing a level of a voltage applied for changing a resistive state of a device by controlling external humidity.

An exemplary embodiment of the present invention provides a resistive switching memory device including: a first electrode; a second electrode formed to be separated from the first electrode; and an insulating layer formed near the first electrode and the second electrode, and changed to one of a high resistance state and a low resistance state when a conductive filament is controlled by a change of external humidity or a voltage applied through the first electrode or the second electrode.

When the external humidity becomes equal to or greater than a predetermined write humidity value, the insulating layer may be changed to the low resistance state as the conductive filament is formed by allowing hydrogen ions that increase corresponding to conductivity of hydrogen ions increasing on the insulating layer to lower an oxidization/reduction potential of metal ions.

In the low resistance state, the insulating layer may maintain the low resistance state when the external humidity changes to one humidity value in a range of a predetermined erase humidity value to the write humidity value.

When the external humidity becomes equal to or less than the erase humidity value, the conductive filament may become disconnected and the insulating layer may be changed to the high resistance state.

When a positive voltage that is equal to or greater than a predetermined write voltage level is applied to the first electrode, the conductive filament may be formed, and the insulating layer may be changed to the low resistance state.

When a negative voltage that is equal to or less than a predetermined erase voltage level is applied to the first electrode, the conductive filament may become disconnected and the insulating layer may be changed to a high resistance state.

The first electrode may be formed on an upper side of the insulating layer, and the second electrode may be formed on a lower side of the insulating layer.

The first electrode and the second electrode may be formed on an upper side or a lower side of the insulating layer.

Another embodiment of the present invention provides a resistive switching memory device including: a first electrode; a second electrode formed to be separated from the first electrode; and an insulating layer formed near the first electrode and the second electrode, and changed to one of a high resistance state and a low resistance state when a conductive filament is controlled by a change of external humidity.

When the external humidity becomes equal to or greater than a predetermined write humidity value, the insulating layer may be changed to the low resistance state as the conductive filament is formed by allowing hydrogen ions that increase corresponding to conductivity of hydrogen ions increasing on the insulating layer to lower an oxidization/reduction potential of metal ions.

In the low resistance state, the insulating layer may maintain the low resistance state when the external humidity is changed to one humidity value in a range of a predetermined erase humidity value to the write humidity value.

The conductive filament may become disconnected and the insulating layer may be changed to the high resistance state when the external humidity becomes equal to or less than the erase humidity value.

The insulating layer may include a tyrosine-based peptide material with at least one peptide bond.

According to the exemplary embodiment, the formation of the conductive filament may be controlled corresponding to the change of the voltage applied through the first electrode or the second electrode and the change of external humidity.

According to the exemplary embodiment, the level of the voltage applied for changing the resistive state of the device may be reduced by controlling external humidity.

BRIEF DESCRIPTION OF THE DRAWINGS

FIG. 4A to FIG. 4C show an example of an erase operation of a resistive switching memory device according to an exemplary embodiment.

FIG. 6A and FIG. 6B show an example of humidity values for a write operation and an erase operation of a resistive switching memory device according to an exemplary embodiment.

DETAILED DESCRIPTION OF THE EMBODIMENTS

Figure 1:
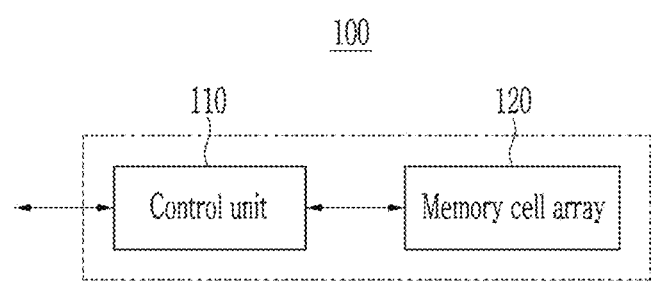
FIG. 1 shows a resistive switching memory apparatus according to an exemplary embodiment.

The present invention is not limited to the exemplary embodiments and may be produced in various forms, and it will be understood by those skilled in the art to which the present invention pertains that exemplary embodiments of the present invention may be implemented in other specific forms without modifying the technical spirit or essential features of the present invention, so it should be understood that the aforementioned exemplary embodiments are illustrative in terms of all aspects and are not limited.

Exemplary embodiments according to the present invention may have various modifications and forms, so the exemplary embodiments will be exemplified in the drawings and described in the present specification. However, this is not to limit the exemplary embodiments of the present invention, and includes modifications, equivalents, or substitutes included in the idea and technical range of the present invention.

Terms such as first or second may be used to describe various configurations, but the constituent elements may not be limited by the terms. The terms are only used to differentiate one component from other components, for example, while not digressing from the claims according to the present invention, a first constituent element may be called a second constituent element, and similarly, a second constituent element may be called a first constituent element.

It is noted that when it is described that a certain constituent element is "connected" or "accessed" to another constituent element, they may be directly connected or electrically connected to each other but a third constituent element may exist therebetween. On the contrary, it is also noted that when it is described that a certain constituent element is "directly connected" or "directly accessed" to another constituent element, a third constituent element does not exist therebetween. In addition, other expressions that describe relationships among constituent elements such as "between," "just between" or "adjacent to" and "directly adjacent to" must be understood in a like manner.

Terms used in the present specification are used for simply explaining a specific exemplary embodiment, and are not intended to limit the present invention. An expression used in the singular encompasses an expression of the plural, unless it has a clearly different meaning in the context. It is to be understood that terms such as "including," "having," etc. are intended to indicate the existence of features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise in the detailed description, all the terms have the same meaning as meanings generally understood by those skilled in the art to which the present invention pertains. Generally used terms such as terms defined in a dictionary should be interpreted as the same meanings as meanings within a context of the related art, and should not be interpreted as ideally or excessively formal meanings unless clearly defined in the present specification.

An exemplary embodiment of the present invention will now be described in detail with reference to accompanying drawings. However, the range of the present application is not limited by exemplary embodiments. Like reference numerals may refer to the same or corresponding constituent elements illustrated in the respective drawings.

A resistive switching memory apparatus will now be described with reference to accompanying drawings.

FIG. 1 shows a resistive switching memory apparatus according to an exemplary embodiment.

Referring to FIG. 1, the resistive switching memory apparatus 100 according to an exemplary embodiment may include a control unit 110 and a memory cell array 120.

The memory cell array 120 may include a plurality of resistive switching memory devices, and the respective resistive switching memory devices may be operable in a humidity mode or a voltage mode, or they may be operable in the humidity mode and the voltage mode.

For example, the resistive switching memory device according to an exemplary embodiment may be a memristor.

The humidity mode may be a mode for controlling a resistive state of the resistive switching memory device by controlling a change of external humidity around the resistive switching memory device, and the voltage mode may be a mode for controlling a resistive state of the resistive switching memory device by controlling the change of the voltage applied to the resistive switching memory device. In the present exemplary embodiment, external humidity may be external relative humidity.

In detail, a plurality of resistive switching memory devices may control formation of a conductive filament according to an applied voltage and/or a change of external humidity to change resistance of the device to one of a high resistance state and a low resistance state.

For this purpose, the control unit 110 may apply voltages for controlling changes of the resistive states of a plurality of resistive switching memory devices installed in the memory cell array 120.

For example, the voltages applied by the control unit 110 may include a set voltage and a reset voltage applied for a write operation and an erase operation.

The control unit 110 may control external humidity that is humidity of a surrounding environment of a plurality of resistive switching memory devices so as to control the changes of the resistive states of a plurality of resistive switching memory devices installed in the memory cell array 120.

For example, the control unit 110 may control a relative humidity value of the surrounding environment of the resistive switching memory device.

A resistive switching memory device operable by the above-described three modes (a humidity mode, a voltage mode, and a mode in which the humidity mode and the voltage mode are simultaneously operable) according to an exemplary embodiment will now be described in detail.

Figure 2A:
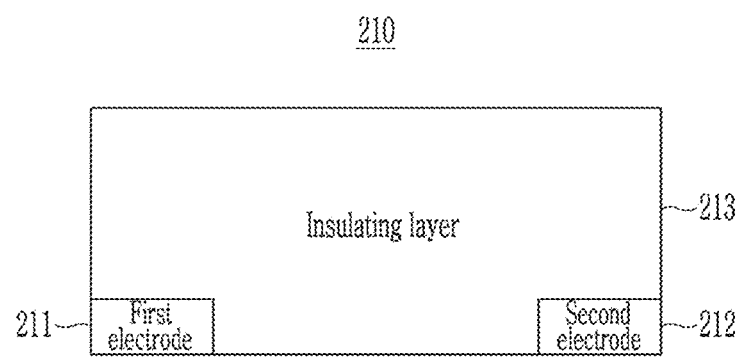
FIG. 2A to FIG. 2C show a resistive switching memory device according to an exemplary embodiment.
Figure 2B:
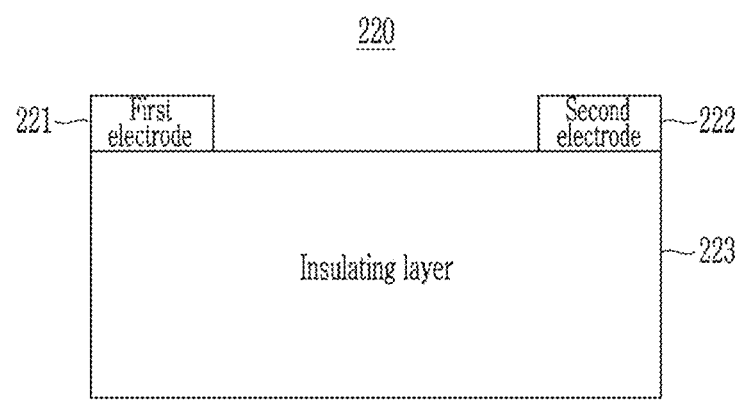
Figure 2C:
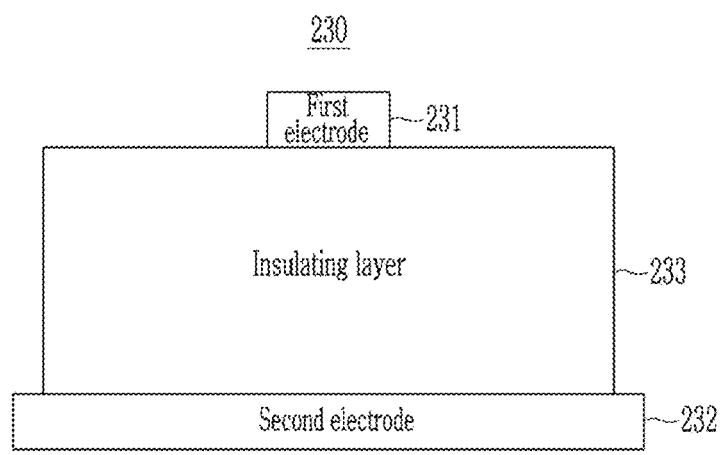

FIG. 2A to FIG. 2C show a resistive switching memory device according to an exemplary embodiment.

In other words, FIG. 2A to FIG. 2C describe an example of the resistive switching memory device according to an exemplary embodiment described with reference to FIG. 1, and portions repeating the descriptions provided with reference to FIG. 1 from among contents to be described with reference to FIG. 2A to FIG. 2C will be omitted.

Referring to FIG. 2A to FIG. 2C, the resistive switching memory devices 210, 220, and 230 according to an exemplary embodiment may control formation of a conductive filament corresponding to the change of external humidity as well as the change of the voltage applied through the first electrode and the second electrode.

For this purpose, the resistive switching memory devices 210, 220, and 230 according to an exemplary embodiment may include first electrodes 211, 221, and 231, second electrodes 212, 222, and 232 separated from the first electrodes 211, 221, and 231, and insulating layers 213, 223, and 233 positioned adjacent to the first electrodes 211, 221, and 231 and the second electrodes 212, 222, and 232.

The first electrode 211 and the second electrode 212 may be positioned on a lower side of the insulating layer 213. In other words, the resistive switching memory device 210 according to an exemplary embodiment may have a lower electrode configuration as shown in FIG. 2A.

The first electrode 221 and the second electrode 222 may be positioned on an upper side of the insulating layer 223. In other words, the resistive switching memory device 220 according to an exemplary embodiment may have an upper electrode configuration as shown in FIG. 2B.

The first electrode 231 may be positioned on an upper side of the insulating layer 233, and the second electrode 232 may be positioned on a lower side of the insulating layer 233. In other words, the resistive switching memory device 230 according to an exemplary embodiment may have a vertical metal-insulator-metal (MIM) configuration as shown in FIG. 2C.

A configuration of the resistive switching memory device 210 according to an exemplary embodiment will now be described in detail with reference to FIG. 2A.

The descriptions on the first electrodes 221 and 231, the second electrodes 222 and 232, and the insulating layers 223 and 233 installed in the resistive switching memory devices 220 and 230 described with reference to FIG. 2B and FIG. 2C correspond to the descriptions on the first electrode 211, the second electrode 212, and the insulating layer 213 installed in the resistive switching memory device 210 described with reference to FIG. 2A, so no repeated descriptions will be provided below.

The first electrode 211 is a reactive metal that may be oxidized, and it may include silver (Ag), copper (Cu), magnesium (Mg), titanium (Ti), tungsten (W), aluminum (Al), or an alloy material thereof.

The second electrode 212 is a non-reactive metal, and it may include platinum (Pt), iridium (Ir), palladium (Pd), gold (Au), ruthenium (Ru), or an alloy thereof.

The insulating layer 213 may include a material with a high redox active property or high conductivity of hydrogen ions.

For example, the insulating layer 213 may include a tyrosine-based peptide material including at least one peptide bond. The peptide material of the insulating layer 213 may use a peptide including at least one tyrosine and cysteine and configured with five to ten amino acids.

In detail, the peptide basically includes a huge amount of amide groups, so it may be easily bonded to metal ions. Among them, the —OH group formed in the phenol of the tyrosine may be easily bonded to metal ions in a deprotonation environment.

The phenol (—OH) group is electrochemical reactive, so it may play an important role of proton coupled electron transfer (POET). By this, the tyrosine may have a redox active property and high conductivity of hydrogen ions.

When external humidity becomes equal to or greater than a predetermined write humidity value, the hydrogen ions that have increased as conductivity of the hydrogen ions increase on the insulating layer 213 lower an oxidization/reduction potential of metal ions to form a conductive filament, and as the conductive filament is formed, the insulating layer 213 may be changed to a low resistance state (LRS). When the external humidity becomes equal to or less than an erase humidity value, the conductive filament becomes disconnected and the insulating layer 213 may be changed to a high resistance state (HRS).

Here, the external humidity may be measured by positioning a humidity sensor near the resistive switching memory device according to an exemplary embodiment. The external humidity may be relative humidity around the resistive switching memory device. For example, the humidity sensor may be an apparatus for sensing a temperature and humidity in a condition of equal to or greater than 2 Hz. Depending on exemplary embodiments, the write operation or the erase operation of the memory device may be detected according to the external humidity sensed by the humidity sensor.

When a positive voltage that is equal to or greater than a predetermined write voltage level is applied to the first electrode or the second electrode, a conductive filament may be formed on the insulating layer 213, and the resistive switching memory device may be changed to the low resistance state. When a negative voltage that is equal to or less than a predetermined erase voltage level applied to the first electrode or the second electrode, the conductive filament may become disconnected and the insulating layer 213 may be changed to the high resistance state.

A write operation and an erase operation of the resistive switching memory device according to an exemplary embodiment will now be described with reference to FIG. 3A to FIG. 4C.

Figure 3A:
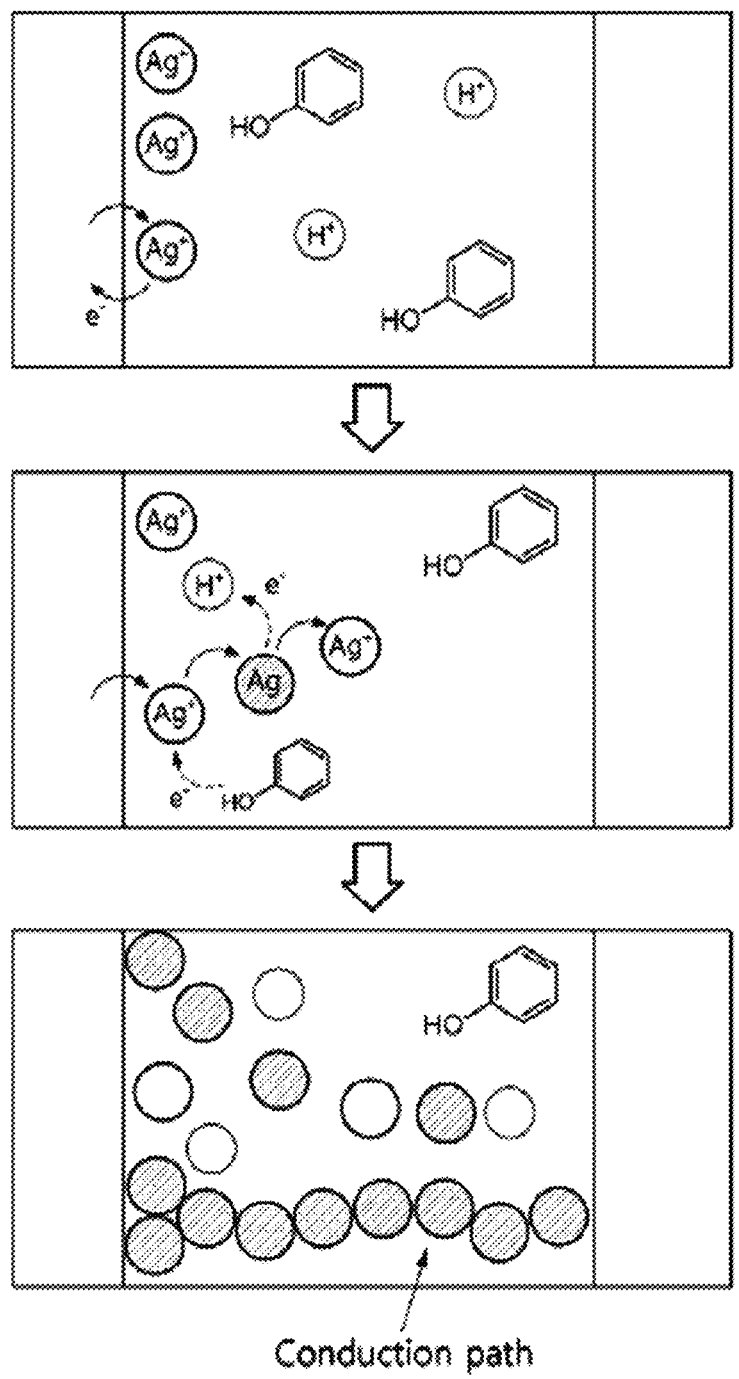
FIG. 3A to FIG. 3C show an example of a write operation of a resistive switching memory device according to an exemplary embodiment.
Figure 3B:
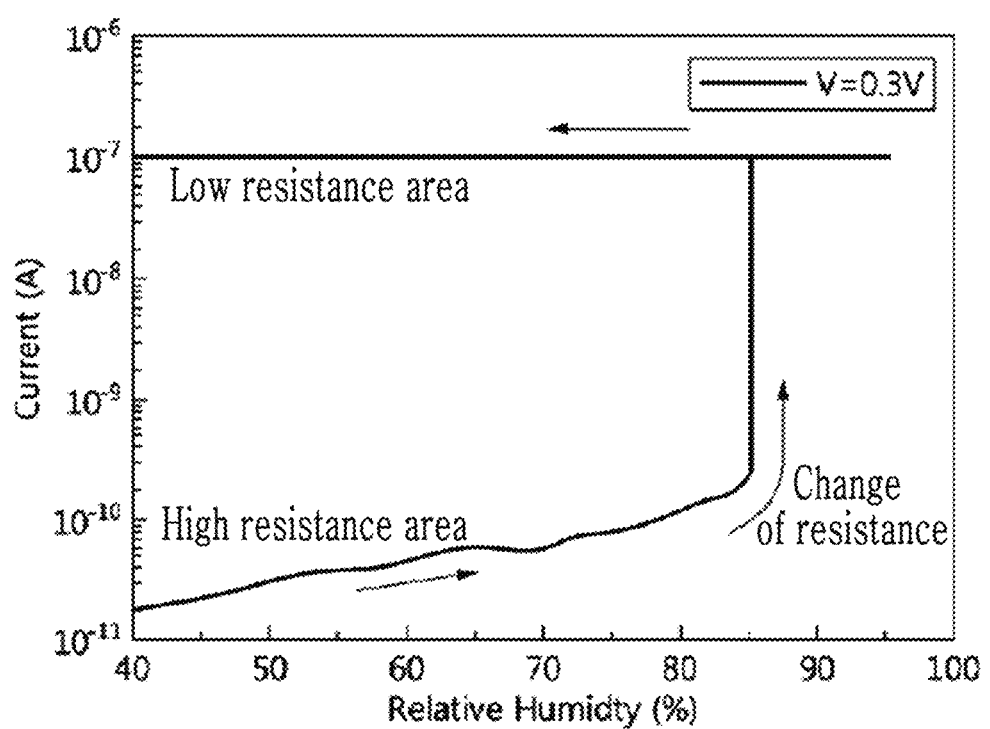
Figure 3C:
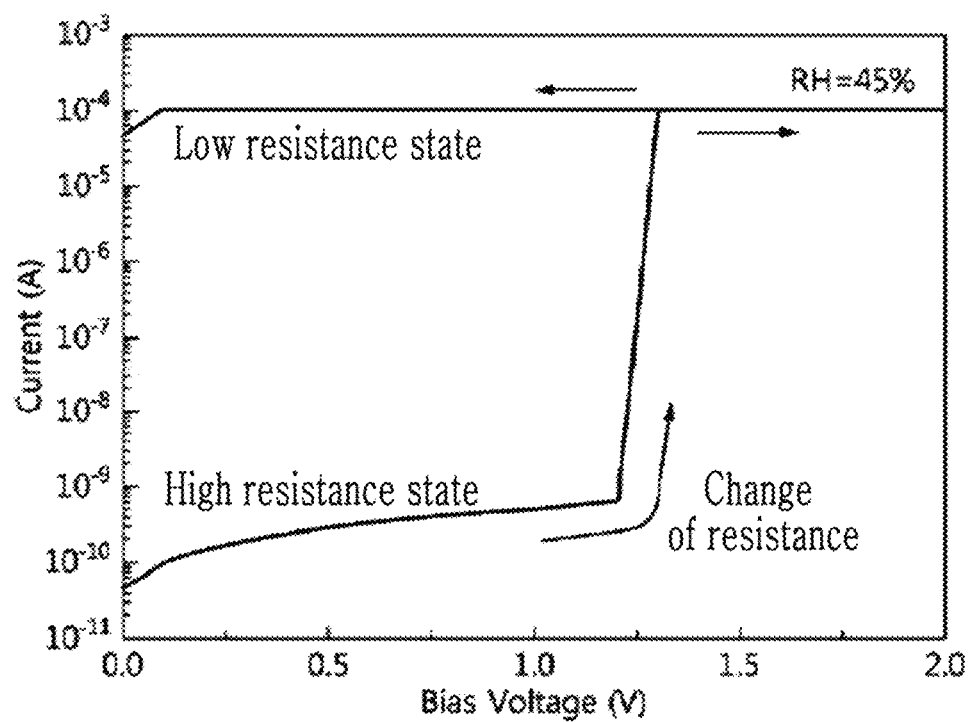
Figure 4A:
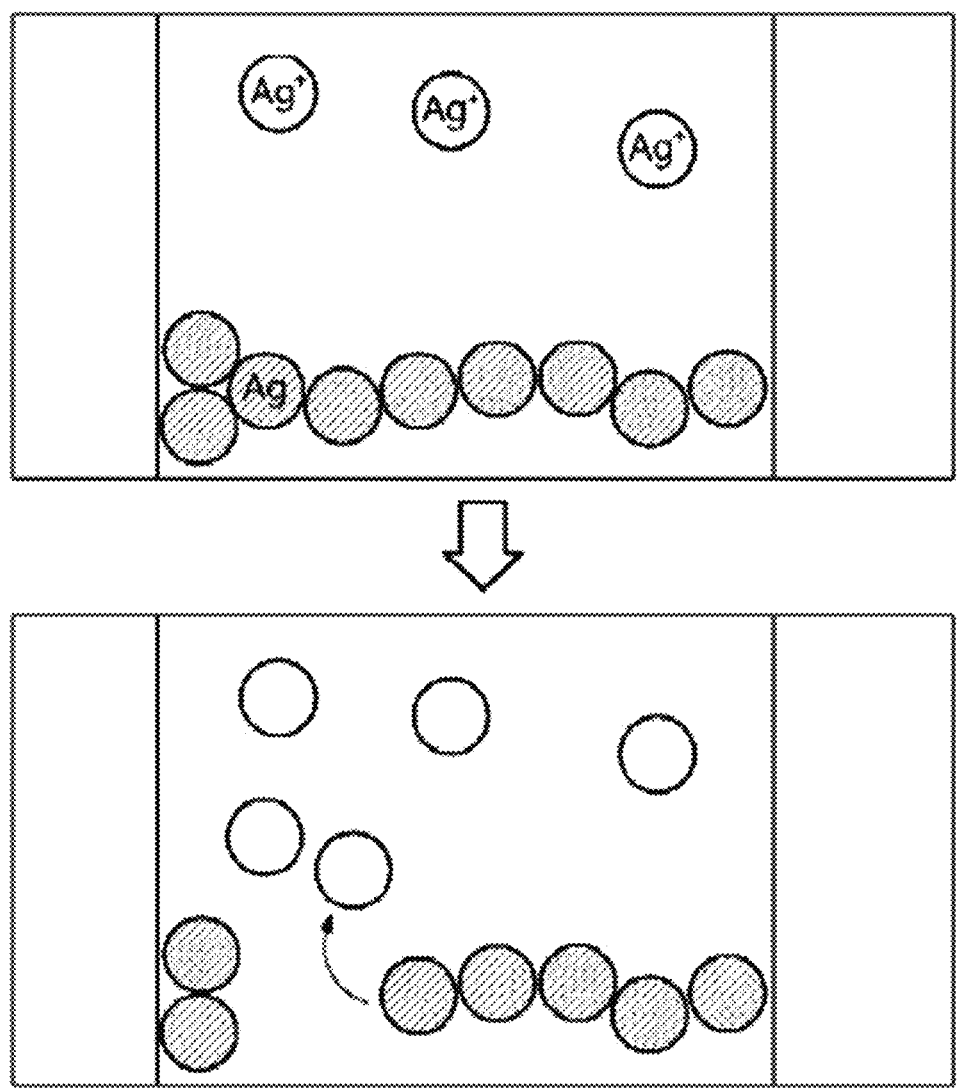
Figure 4B:
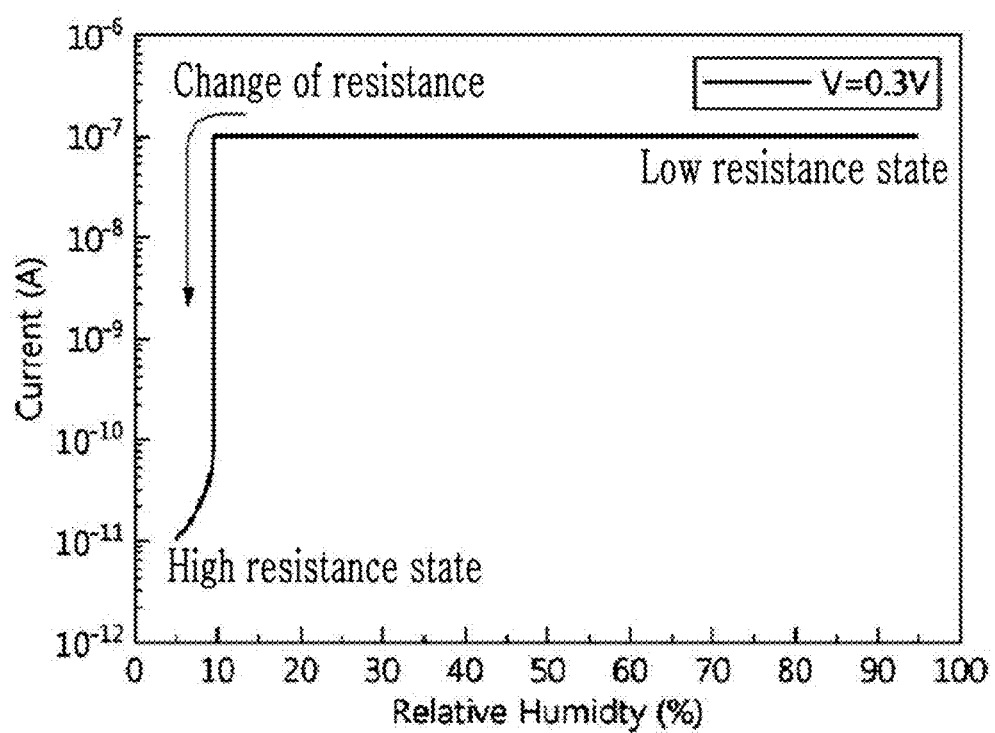

FIG. 3A to FIG. 3C show an example of a write operation of a resistive switching memory device according to an exemplary embodiment, and FIG. 4A to FIG. 4C show an example of an erase operation of a resistive switching memory device according to an exemplary embodiment.

FIG. 3A to FIG. 3C show an example of a resistive switching memory device according to an exemplary embodiment described with reference to FIG. 1 and FIG. 2, and portions repeating the descriptions provided with reference to FIG. 1 and FIG. 2 from among contents to be described with reference to FIG. 3A to FIG. 3C will be omitted.

FIG. 3A shows a schematic view of a write operation of a resistive switching memory device according to an exemplary embodiment, FIG. 3B shows changes of current with respect to changes of relative humidity in a humidity mode, and FIG. 3C shows changes of current with respect to changes of voltage (Bias Voltage) in a voltage mode.

Referring to FIG. 3A, when the first electrode is oxidized by the voltage or humidity applied to the first electrode and is ionized, the oxidized ions are moved through an insulating layer, and the moved ions are reduced and stacked on the second electrode surface, so the resistive switching memory device according to an exemplary embodiment may form a conductive filament. That is, the resistive switching memory device may form a conductive filament when operated in a humidity mode or a voltage mode, or when operated in the humidity mode and the voltage mode.

Referring to FIG. 3B, when external humidity becomes equal to or greater than a predetermined write humidity value in the humidity mode, the resistive switching memory device according to an exemplary embodiment may form a conductive filament by allowing the hydrogen ions that have increased as conductivity of the hydrogen ion increases on the insulating layer to lower the oxidization/reduction potential of metal ions. As the conductive filament is formed on the insulating layer, the resistive switching memory device may be changed to the low resistance state (LRS). For example, the predetermined write humidity value may be more than 80% of the relative humidity value, and the metal ions may be silver (Ag) ions.

For a detailed example, a current flowing to the resistive switching memory device may be maintained at about $10^{-7}$ A when a positive read voltage having a voltage value in the range of 0.3 V to 1.2 V is applied through the first electrode, and the external humidity value is controlled in the humidity range of 80% to 95%. That is, the write operation by which the resistive state of the resistive switching memory device is changed to the low resistance state may be performed.

The insulating layer of the resistive switching memory device may maintain the low resistance state when the external humidity is changed to one humidity value in the range of the predetermined erase humidity value to the write humidity value in the low resistance state.

For example, the predetermined erase humidity value may be a humidity value in a vacuous condition, and for detailed example, the predetermined erase humidity value may be a relative humidity value of 0% to 20%.

In other words, when an external humidity value is controlled to be equal to or greater than the predetermined write humidity value and the insulating layer is changed to the low resistance state, it may maintain the low resistance state until the external humidity is reduced to be less than the predetermined erase humidity value.

That is, the resistive state of the resistive switching memory device according to an exemplary embodiment does not change when the external humidity is lowered in the low resistance state, so it may realize memory characteristics such a data retention and a write operation, which may be characteristics that differentiate it from the humidity sensor for indicating changes of resistance according to changes of external humidity.

Referring to FIG. 3C, when a positive voltage that is equal to or greater than a predetermined write voltage level is applied to the first electrode in the resistive switching memory device according to an exemplary embodiment in the voltage mode, a conductive filament may be formed on the insulating layer. As the conductive filament is formed on the insulating layer, the resistive switching memory device may be changed to the low resistance state. For example, the predetermined write voltage level may be 1.25 V.

In other words, when a positive voltage of 0.9 V to 3.0 V is applied through the first electrode in the condition in which the external humidity is controlled to be 45%, the resistive switching memory device may perform a write operation for changing the resistive state of the device to the low resistance.

FIG. 4A to FIG. 4C show an example of a resistive switching memory device according to an exemplary embodiment described with reference to FIG. 1 to FIG. 3B, and portions repeating the descriptions provided with reference to FIG. 1 to FIG. 3B from among contents to be described with reference to FIG. 4A to FIG. 4C will be omitted.

FIG. 4A shows a schematic view of an erase operation of a resistive switching memory device according to an exemplary embodiment, FIG. 4B shows changes of current (Current) with respect to changes of relative humidity in a humidity mode, and FIG. 4C shows changes of current (Current) with respect to changes of voltage (Bias Voltage) in a voltage mode.

Referring to FIG. 4A, the resistive switching memory device according to an exemplary embodiment may allow the conductive filament formed on the insulating layer to become disconnected according to the change of the voltage applied to the first electrode or the change of humidity. That is, the resistive switching memory device according to an exemplary embodiment may make the conductive filament disconnected according to the humidity mode, the voltage mode, or the humidity mode and the voltage mode.

Referring to FIG. 4B, when the external humidity becomes equal to or less than the erase humidity value in the humidity mode, the resistive switching memory device according to an exemplary embodiment may make the conductive filament on the insulating layer disconnected and may be changed to the high resistance state (HRS).

For example, when a positive read voltage having a voltage value in the range of 0.3 V to 1.2 V is applied through the first electrode, and an external relative humidity value is controlled in the range of 0% to 20%, the resistive switching memory device according to an exemplary embodiment may perform an erase operation for changing the resistive state of the device to the high resistance state.

Referring to FIG. 4C, when a negative voltage that is equal to or less than a predetermined erase voltage level is applied to the first electrode, the conductive filament may become disconnected and the resistive switching memory device according to an exemplary embodiment may be changed to the high resistance state in the voltage mode. For example, the predetermined erase voltage level may be −1.8 V.

In other words, when the negative voltage of −1.1 V to −5 V is applied through the first electrode in the condition in which external relative humidity is controlled to be 45%, the resistive switching memory device according to an exemplary embodiment may perform an erase operation for changing the resistive state of the device to high resistance.

A characteristic of a resistive switching memory device according to changes of external humidity and/or voltage of the same will now be described with reference to FIG. 5A to FIG. 5D.

Figure 5A:
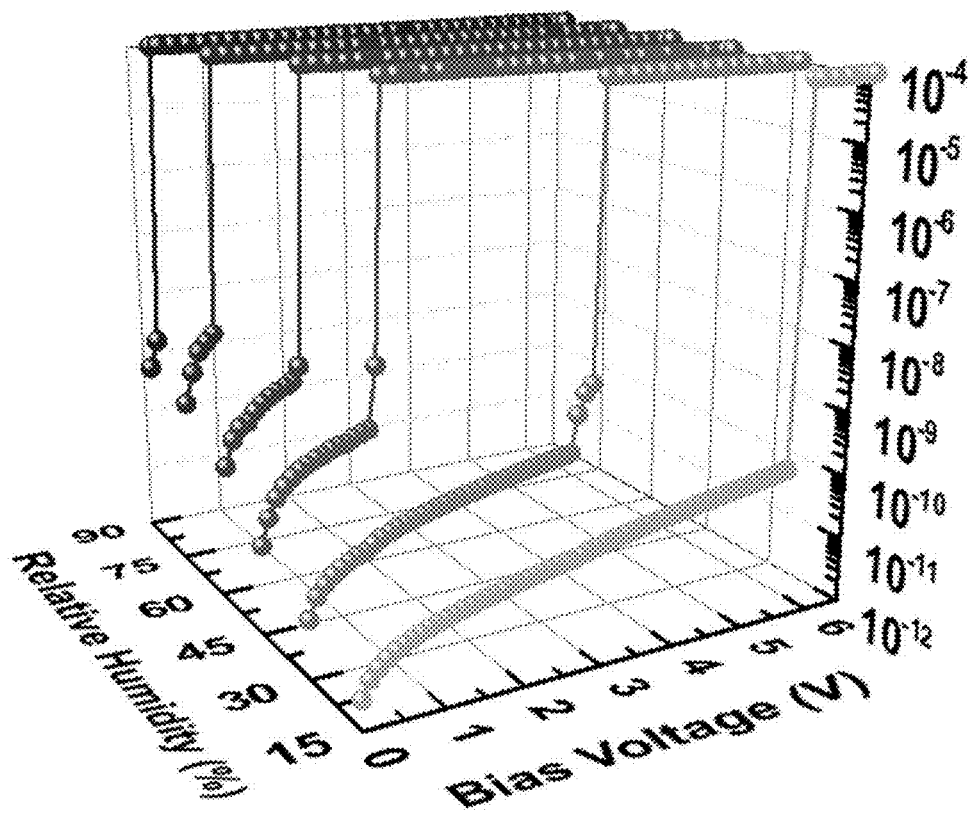
FIG. 5A and FIG. 5B show changes of characteristics of a resistive switching memory device with respect to external humidity and voltage according to an exemplary embodiment.
Figure 5B:
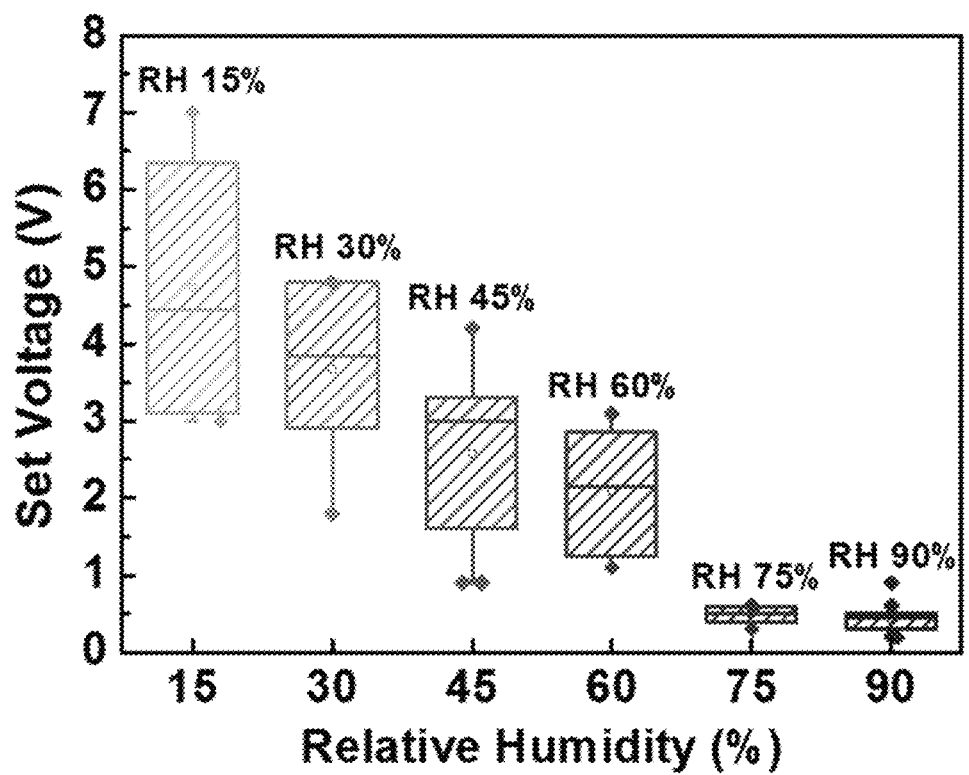

FIG. 5A and FIG. 5B show changes of characteristics of a resistive switching memory device with respect to external humidity and voltage according to an exemplary embodiment.

FIG. 5A shows changes of voltage (Bias Voltage) and current (Current) with respect to external relative humidity, and FIG. 5B shows changes of set voltage (Set Voltage) with respect to external humidity.

Referring to FIG. 5A, when the external humidity changes and the voltage applied through the first electrode or the second electrode changes, conductivity of hydrogen ions changes on the insulating layer and the conductive filament is controlled, so the resistive switching memory device according to an exemplary embodiment may be changed to one of the high resistance state and the low resistance state.

When the external humidity sensed by the electrode becomes equal to or greater than a predetermined write humidity value, and the voltage applied to the electrode is a positive voltage that is equal to or greater than a predetermined write voltage level, the conductivity of hydrogen ions increases on the insulating layer to form a conductive filament, and the resistive switching memory device may be accordingly changed to the low resistance state. On the contrary, when the external humidity becomes equal to or less than the erase humidity value, and the voltage applied to the electrode is a negative voltage that is equal to or less than a predetermined erase voltage level, the conductive filament on the insulating layer may become disconnected, and the resistive switching memory device may be changed to the high resistance state.

In detail, as external relative humidity corresponds to the range of 0 to 90%, and the voltage applied to the electrode increase within the range of 0 V to 6 V, a time for the current to discontinuously increase may be generated. In this instance, the conductivity of hydrogen ions increases on the insulating layer and the conductive filament may be formed. That is, the resistive switching memory device may be changed to the low resistance state as the conductive filament is formed.

In detail, regarding the condition in which external relative humidity is 45%, as the voltage gradually increases, the current gradually increases in proportion to the increase of the voltage, and it may suddenly rise at about 3.5 V. From the time when the current surges, the resistive switching memory device may be found to have entered the low resistance state.

That is, in the present exemplary embodiment, the memory state may be changed in the condition in which the external humidity and the voltage are simultaneously changed, and the memory state may be changed as the voltage changes in the condition in which the external humidity is maintained. As the external humidity becomes higher, the low resistance state of the resistive switching memory device according to an exemplary embodiment may be maintained long.

When the device is in the low resistance state, a size of the current flowing to the resistive switching memory device may be maintained similarly for all humidity values. For example, the current of the resistive switching memory device having entered the low resistance state may be about $10^{-4}$ A regardless of the changes of the relative humidity and the voltage.

Referring to FIG. 5B, it is found in the resistive switching memory device according to an exemplary embodiment that the set voltage for changing resistance of the resistive switching memory device reduces as external humidity increases.

In detail, when the external relative humidity increases by 15%, 30%, 45%, 60%, 75%, and 90%, the set voltage of the resistive switching memory device may be reduced in the range of about 3 V to 6.5 V, about 3 V to 5 V, about 2 V to 3 V, about 1.5 V to 3 V, about 0.5 V to 1 V, and equal to or less than about 0.5 V.

Therefore, when the voltage applied to the electrode is small but the external humidity increases, conductivity of hydrogen ions may increase, so the resistive switching memory device according to an exemplary embodiment may be operated as a memory device for performing a write operation or an erase operation.

That is, the present invention may control the conductive filament by a new driving method according to the change of the voltage and the change of the external humidity.

Figure 5C:
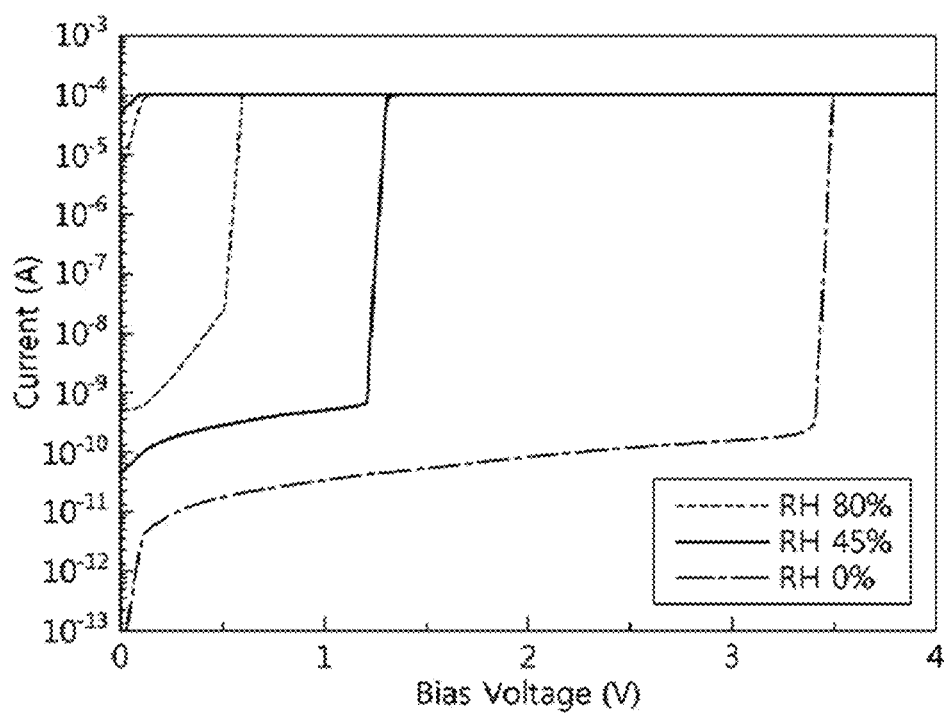
FIG. 5C and FIG. 5D show changes of characteristics of a resistive switching memory device with respect to external humidity according to an exemplary embodiment.
Figure 5D:
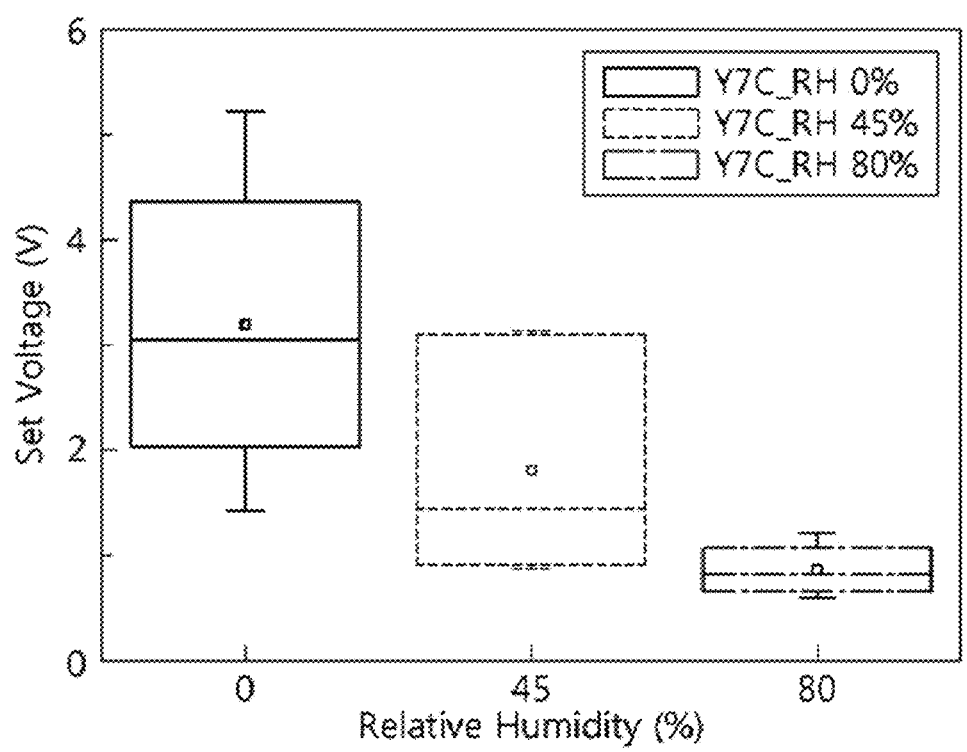

FIG. 5C shows changes of a current (Current) with respect to voltage (Bias Voltage) in a condition in which external humidity is respectively relative humidity of 0%, 45%, and 80%, and FIG. 5D shows changes of a voltage (Set Voltage) with respect to changes of resistance in a condition in which external humidity is respectively relative humidity of 0%, 45%, and 80%.

Referring to FIG. 5C and FIG. 5D, it is found that the memory characteristic changes according to changes of external humidity in the resistive switching memory device according to an exemplary embodiment.

In detail, it is found that, as the external humidity increases, the conductivity of hydrogen ions increases, so the voltage (Set Voltage) for changing resistance of the resistive switching memory device is lowered in the resistive switching memory device according to an exemplary embodiment.

That is, the present invention may control the conductive filament by a new driving method caused by the change of external humidity as well as the change of the voltage.

An operation characteristic of a resistive switching memory device will now be described with reference to FIG. 6A and FIG. 6B.

Figure 6B:
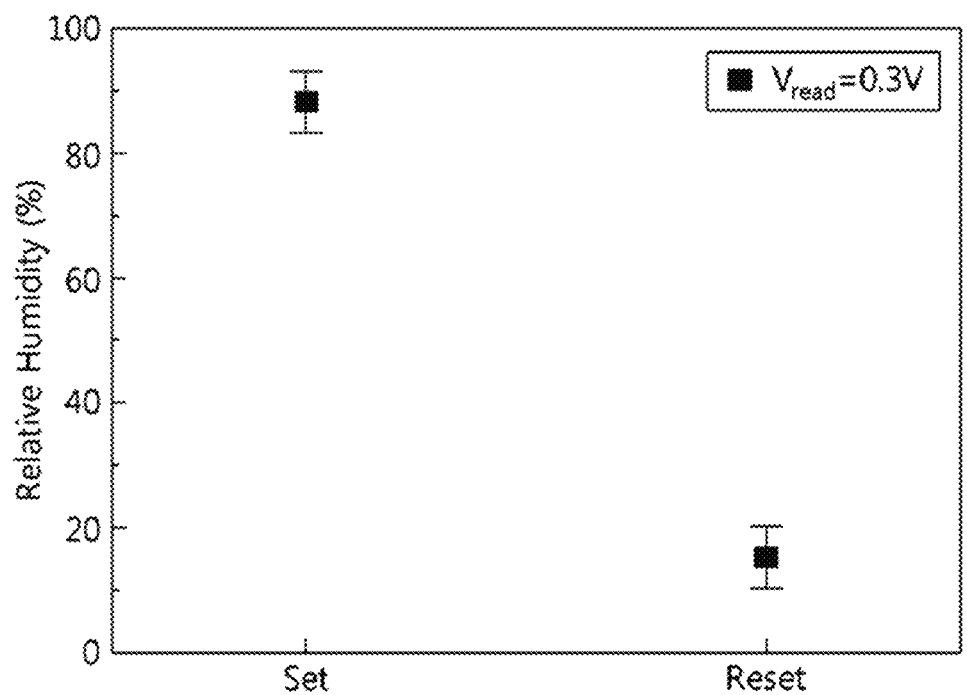

FIG. 6A and FIG. 6B show an example of humidity values for a write operation and an erase operation of a resistive switching memory device according to an exemplary embodiment.

FIG. 6A shows changes of a write humidity value (set humidity) with respect to a read voltage, and FIG. 6B shows an example of a write humidity value (set) and an erase humidity value (reset) in a condition of applying a read voltage (Vread) of 0.3 V.

Referring to FIG. 6A and FIG. 6B, regarding the resistive switching memory device according to an exemplary embodiment, it is shown that the write humidity value in the condition of applying the read voltage of 0.3 V is a relative humidity value of 89.7±3.5%, and the erase humidity value is a relative humidity value of 15.7±5.5%.

Regarding the resistive switching memory device according to an exemplary embodiment, the write humidity value in the condition of applying the read voltage of 1.2 V is a relative humidity value of about 80%.

That is, regarding the resistive switching memory device according to an exemplary embodiment, when the positive read voltage having a voltage value in the range of 0.3 V to 1.2 V is applied, and the external humidity value is controlled within the humidity range of 80% to 95%, the write operation for changing the resistive state of the device to the low resistance state may be performed.

Regarding the resistive switching memory device according to an exemplary embodiment, when the positive read voltage having a voltage value in the range of 0.3 V to 1.2 V is applied, and the external humidity value is controlled within the humidity range of 0% to 20%, the erase operation for changing the resistive state of the device to the high resistance state may be performed.

A characteristic of a resistive switching memory device according to changes of a current compliance level will now be described with reference to FIG. 7A to FIG. 7D.

FIG. 7A to FIG. 7D show changes of erase humidity values with respect to changes of a current compliance level in a resistive switching memory device according to an exemplary embodiment.

Figure 7A:
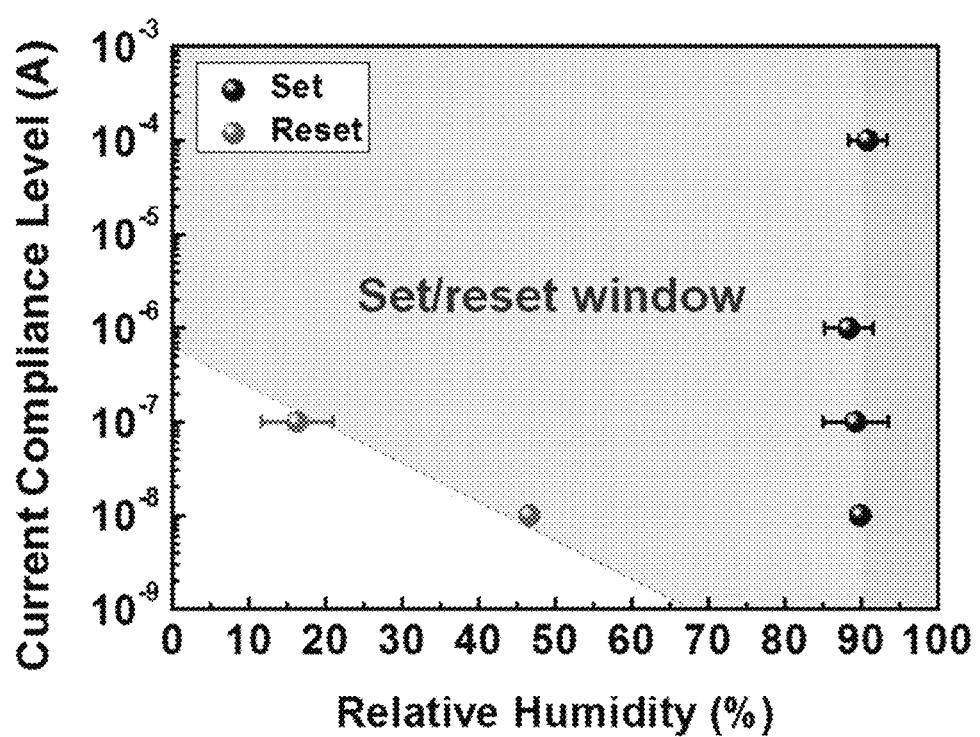
FIG. 7A to FIG. 7D show changes of erase humidity values with respect to changes of a current compliance level in a resistive switching memory device according to an exemplary embodiment.

Referring to FIG. 7A, regarding the resistive switching memory device according to an exemplary embodiment, there may be differences between the methods for performing a reset operation (or an erase operation) according to the current compliance level (Icc) applied when performing a set operation (or a write operation) and humidity.

For example, regarding the resistive switching memory device according to an exemplary embodiment, a reset operation may be performed in a vacuous condition (a condition with extremely low moisture) when a set operation is performed on a high compliance level (Icc>1 μA). A reset operation may be performed with predetermined extremely low humidity when a set operation is performed on a low compliance level (Icc<1 μA), and a reset operation may be performed with more than 20% of humidity when the set operation is performed on a predetermined very low compliance level in the resistive switching memory device. Here, the predetermined low humidity may be a relative humidity value of 0% to 20%.

That is, the resistive switching memory device according to an exemplary embodiment may control the set voltage or the reset voltage as the current compliance level is established.

Figure 7B:
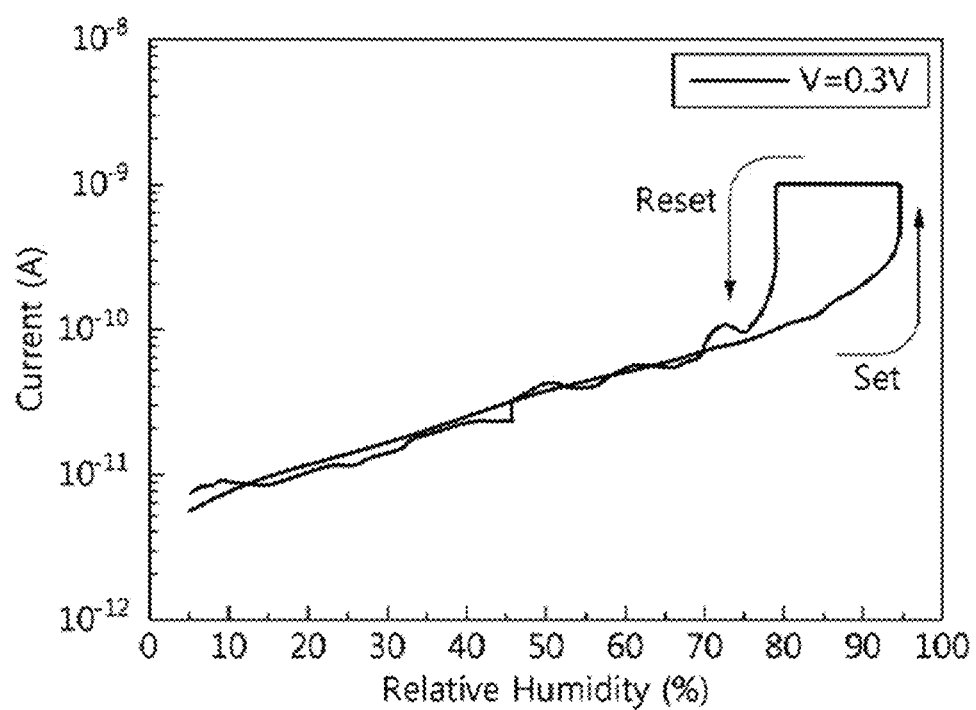
Figure 7C:
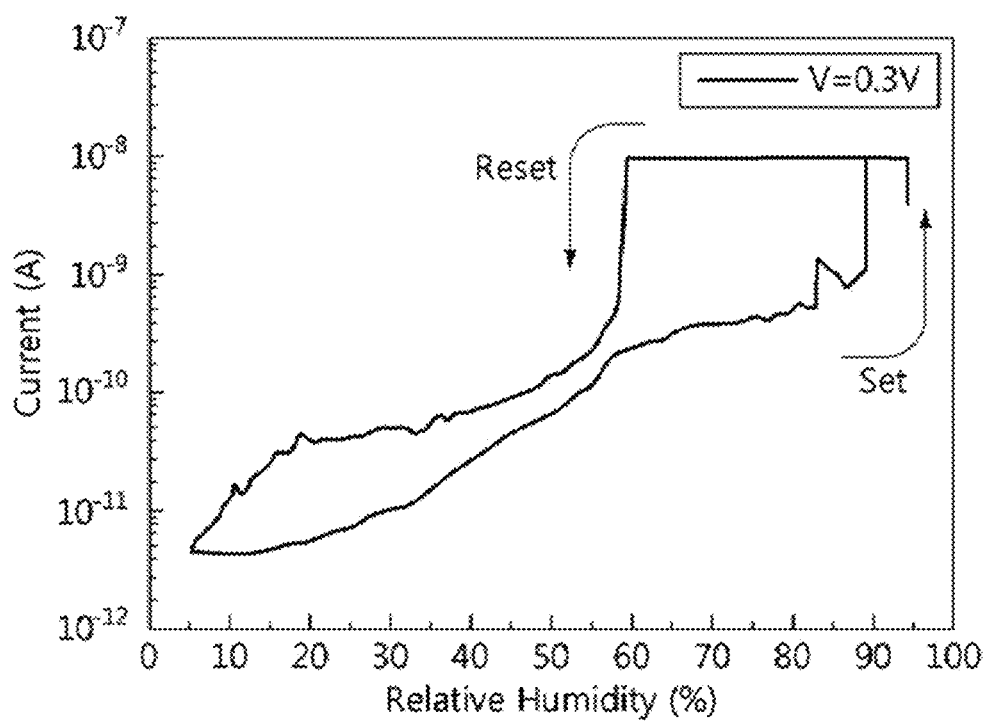
Figure 7D:
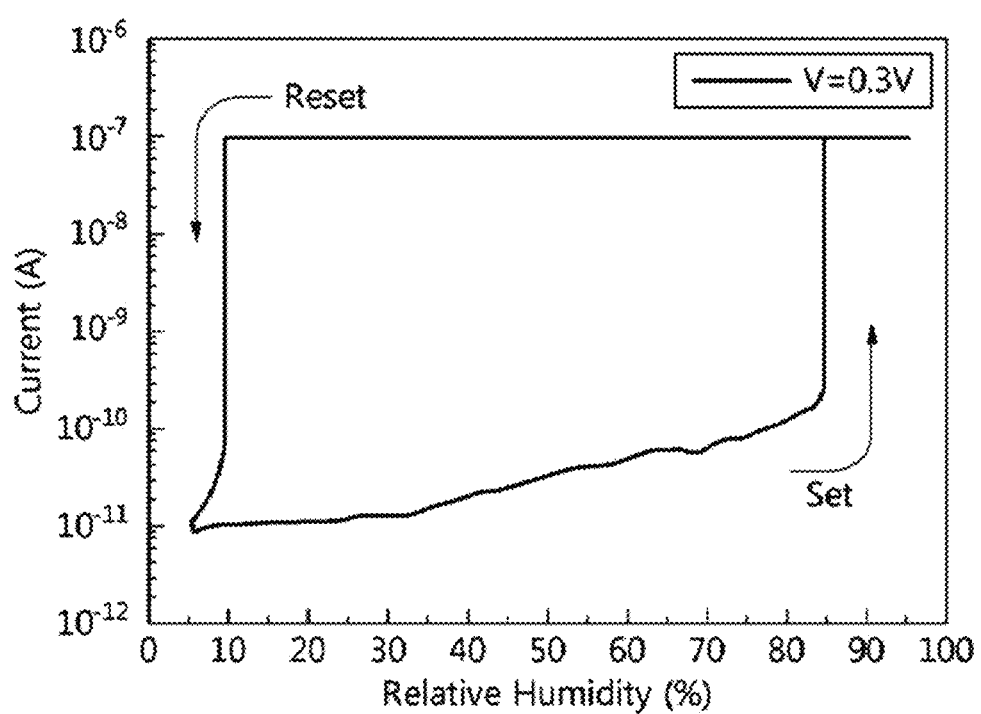

FIG. 7B shows an erase humidity value when a current compliance level is $10^{-9}$ A, FIG. 7C shows an erase humidity value when a current compliance level is $10^{-8}$ A, and FIG. 7D shows an erase humidity value when a current compliance level is $10^{-7}$ A.

Referring to FIG. 7B, the erase humidity value when the current compliance level is $10^{-9}$ A is shown to be about 78%, and referring to FIG. 7C, the erase humidity value when the current compliance level is $10^{-8}$ A is shown to be about 47%. Referring to FIG. 7D, the erase humidity value when the current compliance level is $10^{-7}$ A is shown to be about 16%.

In other words, the erase humidity value of the resistive switching memory device according to an exemplary embodiment may be controlled by controlling the current compliance level, and preferably, the current compliance level may be controlled to be $10^{-7}$ A.

Driving performance of a resistive switching memory device according to an exemplary embodiment will now be described with reference to FIG. 8A and FIG. 8B.

Figure 8A:
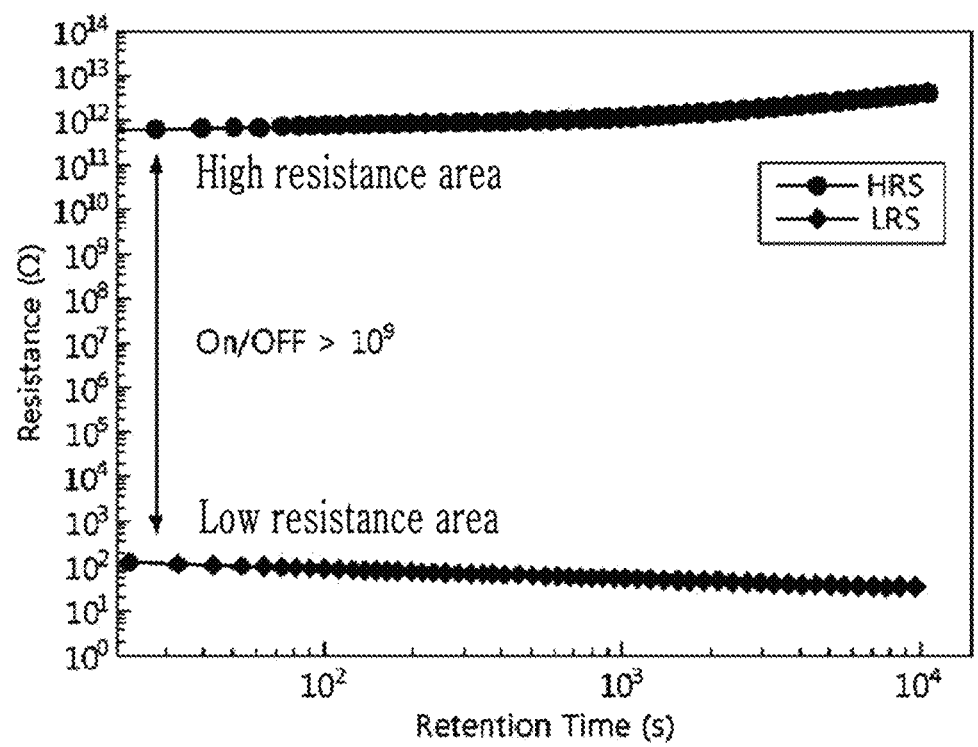
FIG. 8A and FIG. 8B show driving performance of a resistive switching memory device according to an exemplary embodiment.
Figure 8B:
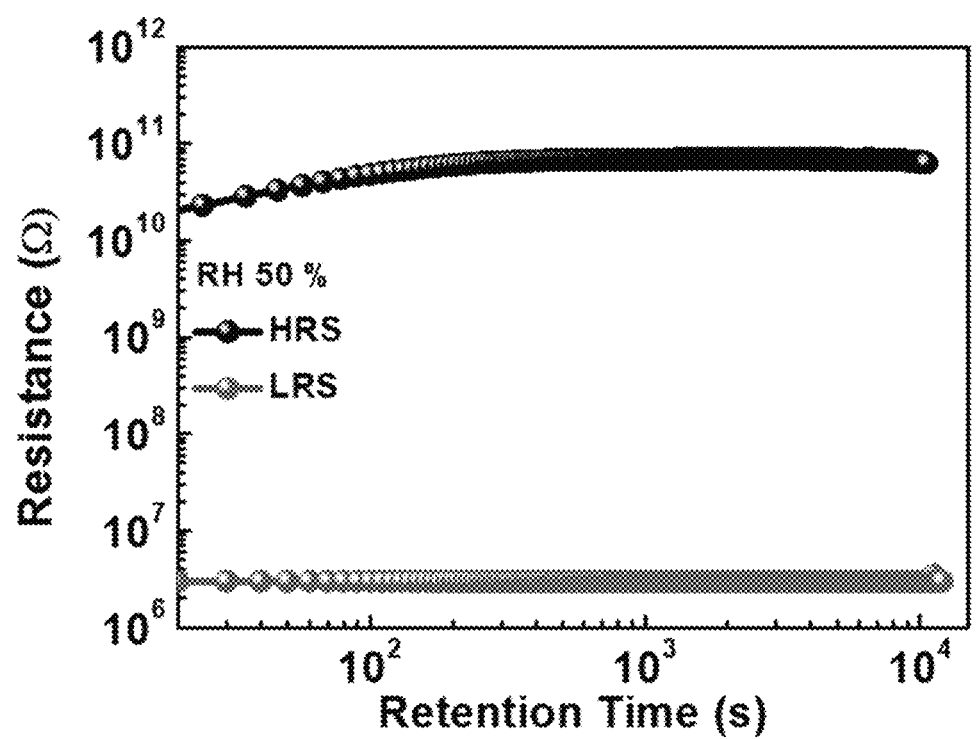

FIG. 8A and FIG. 8B show driving performance of a resistive switching memory device according to an exemplary embodiment.

FIG. 8A and FIG. 8B show changes of resistance with respect to retention time of a resistive switching memory device according to an exemplary embodiment.

FIG. 8A shows a graph measured when a resistive switching memory device according to an exemplary embodiment is operated with respect to changes of a voltage, and FIG. 8B shows a graph measured when a resistive switching memory device according to an exemplary embodiment is operated with respect to changes of external humidity.

Referring to FIG. 8A and FIG. 8B, it is found in the resistive switching memory device according to an exemplary embodiment that information that is stored once is maintained in a stable way for more than $10^4$ s according to the change of resistance from the high resistance area to the low resistance area, and the data retention characteristic is high in the opposite case.

The resistive state of the resistive switching memory device according to an exemplary embodiment is not changed when the external humidity is lowered in the low resistance state, so the memory characteristic caused by the data retention and the write operation may be realized, which represents a differentiated characteristic from the humidity sensor for indicating the change of resistance according to the change of external humidity.

A memory characteristic according to changes of external humidity and/or a voltage will now be described with reference to FIG. 9A and FIG. 9B.

Figure 9A:
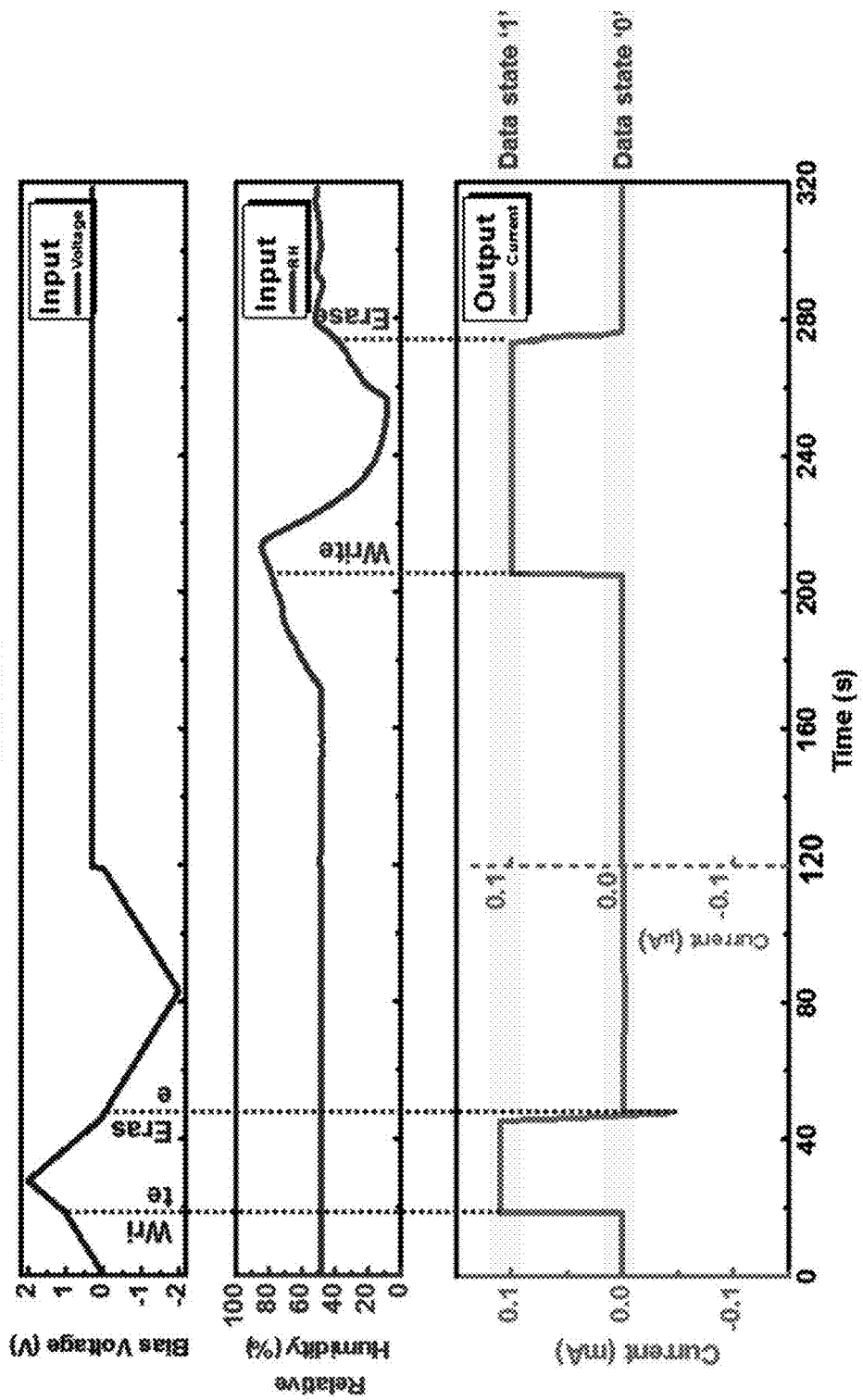
FIG. 9A and FIG. 9B show changes of characteristics of a resistive switching memory device with respect to external humidity or voltage according to an exemplary embodiment.
Figure 9B:
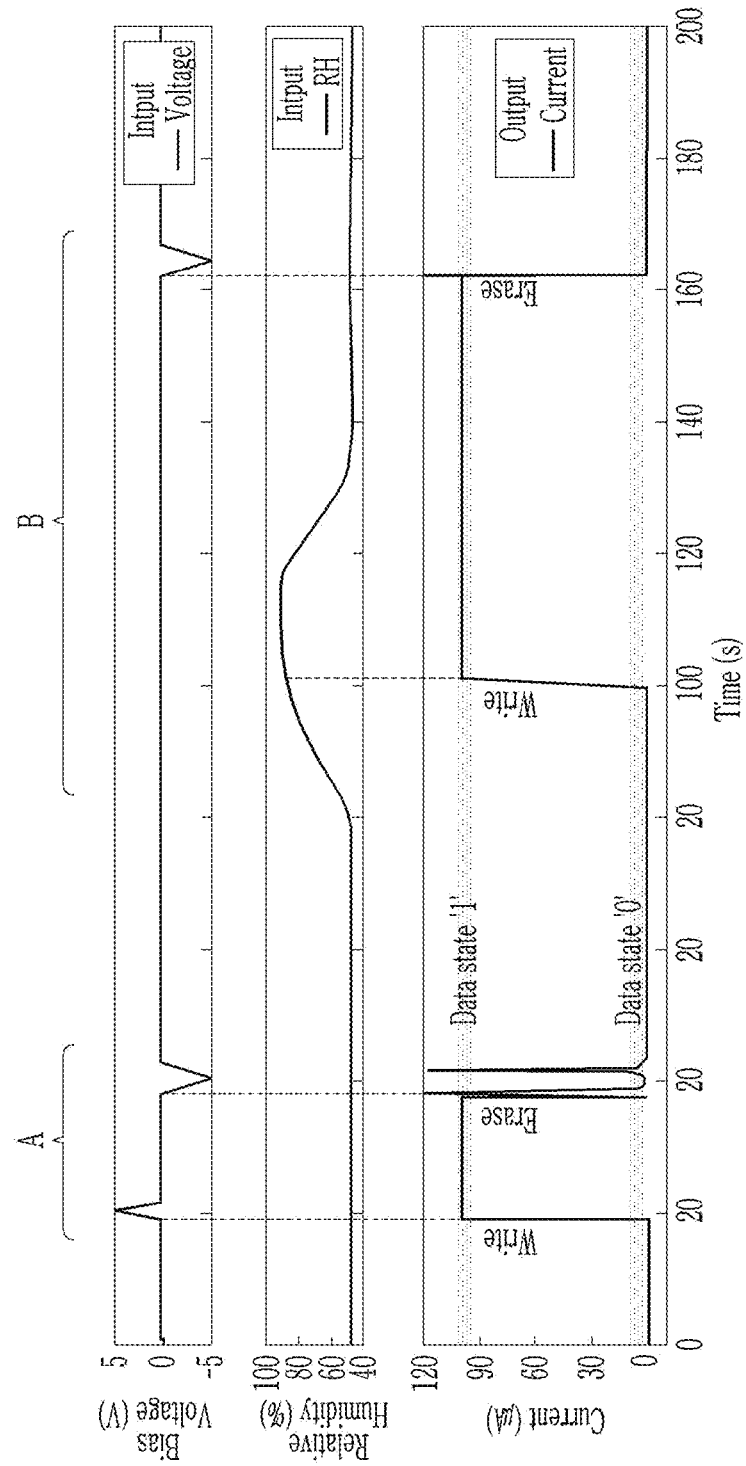

FIG. 9A shows a memory characteristic according to changes of external humidity or voltage, and FIG. 9B shows a memory characteristic according to changes of external humidity and voltage.

Referring to FIG. 9A, it is found in the resistive switching memory device according to an exemplary embodiment that the memory characteristic is changed by external humidity and the voltage in one device.

The resistive switching memory device may perform a write (Write) operation as a conductive filament is formed on the insulating layer when the external humidity is maintained, and the voltage applied to the electrode is a positive voltage that is equal to or greater than a predetermined write voltage level. For example, when a voltage that is equal to or greater than about 1 V is applied through the first electrode, the resistive switching memory device may be driven by the write operation. Here, the external humidity may be maintained at about 50%.

When the external humidity is maintained and the voltage applied to the electrode is a negative voltage that is equal to or less than a predetermined erase voltage level, the conductive filament may become disconnected, the device is changed to the high resistance state, and the erase operation may be performed. For example, when the voltage applied through the first electrode is equal to or less than about −1.8 V, the resistive switching memory device may be driven by the erase operation.

When the external humidity is maintained, and the external humidity is equal to or greater than a predetermined write humidity value, the resistive switching memory device with the memory characteristic that is changed according to the change of the voltage may perform a write (Write) operation as a conductive filament is formed on the insulating layer. For example, when the external humidity is equal to or greater than about 80%, the resistive switching memory device may be driven by the write operation. Here, the voltage applied to the electrode may be maintained at about 0.3 V.

That is, the memory characteristic of the resistive switching memory device according to the present exemplary embodiment may be changed according to the external humidity, and the memory characteristic may be changed according to the voltage.

Referring to FIG. 9B, it is found in the resistive switching memory device according to an exemplary embodiment that the write operation and the erase operation are driven according to external humidity and voltage.

The reference numeral A of FIG. 9B represents a portion for driving the resistive switching memory device according to the voltage when the external humidity is maintained.

The resistive switching memory device may perform a write operation and an erase operation according to the change of the voltage. When the external humidity is maintained, the write operation and the erase operation of the resistive switching memory device correspond to those described with reference to FIG. 9A, so they will not be described.

The reference numeral B of FIG. 9B represents a portion for performing a write operation to the resistive switching memory device according to external humidity, and performing an erase operation according to the voltage.

The resistive switching memory device may perform a write operation according to the change of external humidity when the voltage is maintained, and the memory characteristic of the write operation may be maintained without changing the resistive state when the external humidity is lowered in the low resistance state. When a negative voltage that is equal to or less than a predetermined erase voltage level is applied, the resistive switching memory device may perform an erase operation.

That is, the resistive switching memory device according to the present exemplary embodiment may perform an erase operation by the change of the voltage when performing a write operation by external humidity.

Figure 10:
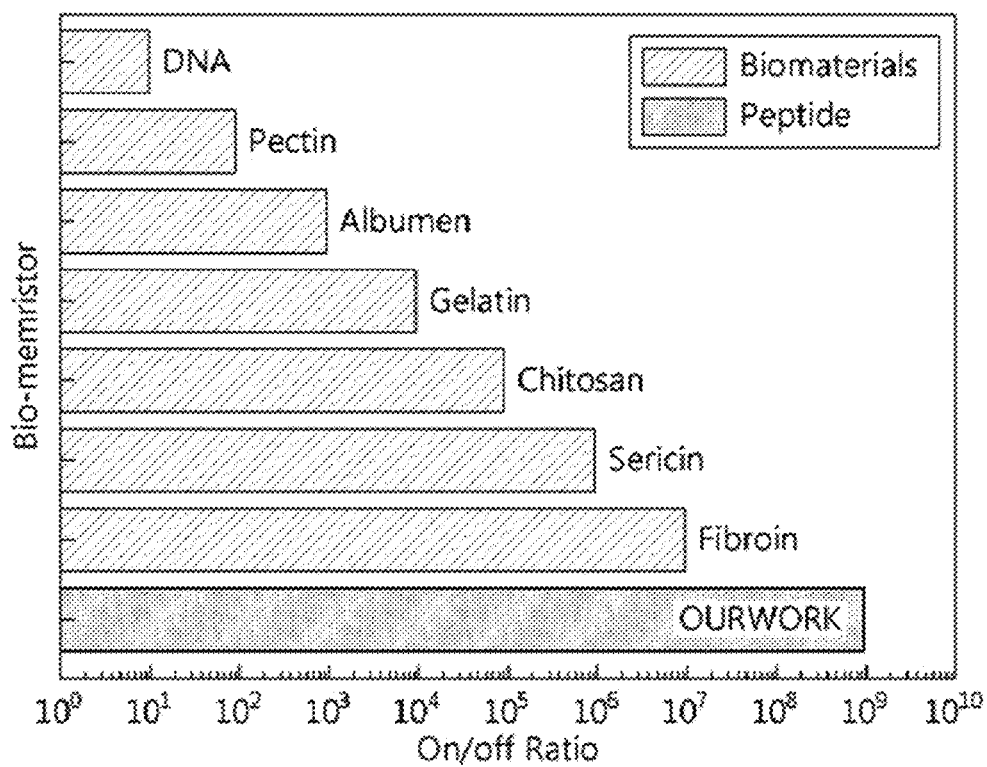
FIG. 10 shows a comparative example between a resistive switching memory device according to an exemplary embodiment and a conventional resistive switching memory device.

FIG. 10 shows a comparative example between a resistive switching memory device according to an exemplary embodiment and a conventional resistive switching memory device.

Referring to FIG. 10, on/off ratio performance of the resistive switching memory device (OURWORK; Peptide) according to an exemplary embodiment and the conventional resistive switching memory device (DNA, Pectin, Albumen, Gelatin, Chitosan, Sericin, Fibroin; Biomaterials) is found.

The resistive switching memory device according to an exemplary embodiment is shown to provide a superbly high on/off ratio in performance comparison to the reported bio memristors (or conventional resistive switching memory devices). In other words, the resistive switching memory device according to an exemplary embodiment is shown to provide excellent performance in comparison to prior art.

A method for manufacturing a resistive switching memory device according to an exemplary embodiment will now be described with reference to FIG. 11.

Figure 11:
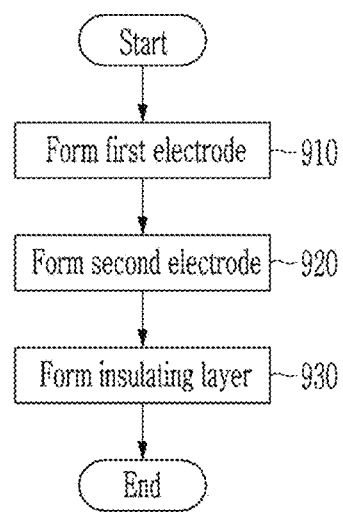
FIG. 11 shows a method for manufacturing a resistive switching memory device according to an exemplary embodiment.

FIG. 11 shows a method for manufacturing a resistive switching memory device according to an exemplary embodiment.

In other words, FIG. 11 shows an example of a method for manufacturing a resistive switching memory device according to an exemplary embodiment described with reference to FIG. 1 to FIG. 10, and portions repeating the descriptions provided with reference to FIG. 1 to FIG. 10 from among contents to be described with reference to FIG. 9 will be omitted.

Referring to FIG. 11, the method for manufacturing a resistive switching memory device according to an exemplary embodiment may sequentially perform Steps 910 to 930 when the memory device has a lower electrode structure.

The method for manufacturing a resistive switching memory device according to an exemplary embodiment may sequentially perform Steps 930, 910, and 920 when the memory device has an upper electrode structure.

The method for manufacturing a resistive switching memory device according to an exemplary embodiment may sequentially perform Steps 920, 930, and 910 when the memory device has a vertical metal-insulator-metal (MIM) structure.

In detail, in Step 910, the method for manufacturing a resistive switching memory device according to an exemplary embodiment may form a first electrode.

For example, the first electrode is a reactive metal that may be oxidized, and it may include silver (Ag), copper (Cu), magnesium (Mg), titanium (Ti), tungsten (W), aluminum (Al), or an alloy material thereof.

In Step 920, the method for manufacturing a resistive switching memory device according to an exemplary embodiment may form a second electrode separated from the first electrode.

For example, the second electrode is a non-reactive metal, and it may include platinum (Pt), iridium (Ir), palladium (Pd), gold (Au), ruthenium (Ru), or an alloy thereof.

In Step 930, the method for manufacturing a resistive switching memory device according to an exemplary embodiment may include forming an insulating layer that is changed to one of the high resistance state and the low resistance state when the conductive filament is controlled according to the changes of the voltage applied through the first electrode or the second electrode, or external humidity, near the first electrode and the second electrode.

When the external humidity becomes equal to or greater than a predetermined write humidity value, the hydrogen ions that increase on the insulating layer as the conductivity of hydrogen ions increases lower an oxidization/reduction potential of metal ions, so the conductive filament may be formed on the insulating layer, and as the conductive filament is formed, the insulating layer may be changed to the low resistance state (LRS).

The insulating layer, in the low resistance state, may maintain the low resistance state when the external humidity is changed to one humidity value in the range of the predetermined erase humidity value to the write humidity value.

When the external humidity becomes equal to or less than the erase humidity value, the conductive filament may become disconnected, and the insulating layer may be changed to the high resistance state (HRS).

The insulating layer may include a tyrosine-based peptide material including at least one peptide bond.

In detail, the peptide basically includes a huge amount of the amide group, so it may be easily bonded to the metal ions. Among them, the —OH group formed in the phenol of the tyrosine may be easily bonded to metal ions in a deprotonation environment.

By this, the tyrosine may influence ion conductivity through the bond with metal ions.

When a positive voltage that is equal to or greater than a predetermined write voltage level is applied to first electrode, a conductive filament may be formed and the insulating layer may be changed to the low resistance state.

When a negative voltage that is equal to or less than a predetermined erase voltage level is applied to the first electrode, the conductive filament may become disconnected and the insulating layer may be changed to the high resistance state.

As a result, by using the present invention, the change of the voltage applied through the first to second electrodes, and the formation of the conductive filament corresponding to the change of external humidity may be controlled.

The level of the voltage applied for changing the resistive state of the device may be reduced by controlling the external humidity.

Although the embodiments have been described by the limited embodiments as described above, various modifications and variations are possible to those skilled in the art from the above description. For example, the described techniques may be performed in a different order than the described method, and/or components of the described systems, structures, devices, circuits, materials, etc. may be combined or assembled in a different form than the described method, or appropriate results may be achieved even if replaced or substituted by other components or equivalents.

Therefore, the scope of the present disclosure should not be limited to the described embodiments, but should be defined by the claims below and equivalents thereof.

DESCRIPTION OF SYMBOLS

210: resistive switching memory device
211: first electrode
212: second electrode
213: insulating layer

What is claimed is:

1. A resistive switching memory device comprising:
a first electrode;
a second electrode formed to be separated from the first electrode; and
an insulating layer formed near the first electrode and the second electrode, and changed to one of a high resistance state and a low resistance state when a conductive filament is controlled by a change of external humidity or a voltage applied through the first electrode or the second electrode,
wherein when the external humidity becomes equal to or greater than a predetermined write humidity value, the insulating layer is changed to the low resistance state as the conductive filament is formed by allowing hydrogen ions that increase corresponding to conductivity of hydrogen ions increasing on the insulating layer to lower an oxidization/reduction potential of metal ions.

2. The resistive switching memory device of claim 1, wherein
in the low resistance state, the insulating layer maintains the low resistance state when the external humidity changes to one humidity value in a range of a predetermined erase humidity value to the write humidity value.

3. The resistive switching memory device of claim 2, wherein
when the external humidity becomes equal to or less than the erase humidity value, the conductive filament becomes disconnected and the insulating layer is changed to the high resistance state.

4. The resistive switching memory device of claim 1, wherein
when a positive voltage that is equal to or greater than a predetermined write voltage level is applied to the first electrode, the conductive filament is formed, and the insulating layer is changed to the low resistance state.

5. The resistive switching memory device of claim 1, wherein
when a negative voltage that is equal to or less than a predetermined erase voltage level is applied to the first electrode, the conductive filament becomes disconnected and the insulating layer is changed to a high resistance state.

6. The resistive switching memory device of claim 1, wherein
the first electrode is formed on an upper side of the insulating layer, and the second electrode is formed on a lower side of the insulating layer.

7. The resistive switching memory device of claim 1, wherein
the first electrode and the second electrode are formed on an upper side or a lower side of the insulating layer.

8. A resistive switching memory device comprising:
a first electrode;
a second electrode formed to be separated from the first electrode; and
an insulating layer formed near the first electrode and the second electrode, and changed to one of a high resistance state and a low resistance state when a conductive filament is controlled by a change of external humidity.

9. The resistive switching memory device of claim 8, wherein
when the external humidity becomes equal to or greater than a predetermined write humidity value, the insulating layer is changed to the low resistance state as the conductive filament is formed by allowing hydrogen ions that increase corresponding to conductivity of hydrogen ions increasing on the insulating layer to lower an oxidization/reduction potential of metal ions.

10. The resistive switching memory device of claim 9, wherein
in the low resistance state, the insulating layer maintains the low resistance state when the external humidity is changed to one humidity value in a range of a predetermined erase humidity value to the write humidity value.

11. The resistive switching memory device of claim 10, wherein
the conductive filament becomes disconnected and the insulating layer is changed to the high resistance state when the external humidity becomes equal to or less than the erase humidity value.

12. The resistive switching memory device of claim 8, wherein
the insulating layer includes a tyrosine-based peptide material with at least one peptide bond.

\* \* \* \* \*